United States Patent [19]

Adams

[11] 4,266,215

[45] May 5, 1981

[54] REVERSIBLE INCREMENTAL ENCODING METHOD AND APPARATUS

[75] Inventor: Walter P. Adams, Salt Lake City, Utah

[73] Assignee: The Raymond Corporation, Greene, N.Y.

[21] Appl. No.: 961,125

[22] Filed: Nov. 16, 1978

[51] Int. Cl.³ .............................................. H03K 13/00
[52] U.S. Cl. ........................... 340/347 P; 340/347 M; 340/347 CC; 177/185; 235/92 MP
[58] Field of Search ....... 340/347 M, 347 P, 347 AD, 340/347 CC; 250/231 SE; 235/92 MP, 92 EV; 177/DIG. 6, DIG. 1, 185

[56] References Cited

U.S. PATENT DOCUMENTS

| | | | |
|---|---|---|---|
| 2,656,106 | 10/1953 | Stabler | 340/347 P |
| 3,740,532 | 6/1973 | Esch | 235/92 MP X |
| 4,047,007 | 6/1977 | Dlugos et al. | 340/347 P X |

*Primary Examiner*—Thomas J. Sloyan
*Attorney, Agent, or Firm*—Richard G. Stephens

[57] ABSTRACT

Two-phase logic signals from a reversible shaft encoder or like device provide count occurrence pulses and a count direction logic signal to control incrementing and decrementing of a counting means. One count occurrence pulse is omitted each time the count direction changes to avoid errors which otherwise might result. Up counts and down counts occur at the same shaft encoder positions, and the system has high noise immunity.

5 Claims, 5 Drawing Figures

REVERSIBLE INCREMENTAL ENCODING METHOD AND APPARATUS

This invention relates to incremental shaft or position encoding and counting, and more particularly, to improved means for connecting signals from a conventional two-phase shaft encoder to a microprocessor or digital counter. The invention was conceived in connection with a system for monitoring and controlling the elevation of a load carriage on a lift truck mast, but it will become apparent that the invention is readily applicable in numerous other applications.

The direction of movement of a lift truck load carriage is normally reversed many times intentionally while the truck is in operation lifting and lowering loads. Further, mainly because of the stretch in lift chains, when such a carriage is stopped, it may oscillate about some final position for some time, experiencing further unintentional reversals, and consequent reversals in the rotation of any shaft encoder connected to sense carriage motion. Various arrangements which conceivably might be used to connect encoder signals to a microprocessor or counter are unsatisfactory because reversals can cause counting errors and provide an erroneous indication of carriage position. One object of the present invention is to provide improved means for incremental shaft or position digitizing which are less subject to error from frequent shaft reversals.

Various devices used on battery-powered lift trucks tend to create substantial electrical noise. Some arrangements which conceivably might be used to connect encoder signals to a microprocessor or counter are unsatisfactory because they are unduly susceptible to noise. Thus another object of the present invention is to provide improved means for incremental shaft or position digitizing which are less susceptible to noise.

Some systems which have been devised for incremental encoding are disadvantageous because they provide counts at different angular positions of an encoder when counting up than the positions at which counts occur for down counting. To give a simplified example, some systems might provide up count signals at odd-numbered degrees of rotation, but provide down counts at even-numbered degrees of rotation, which introduces backlash and decreases accuracy. Another object of the invention is to provide an encoder signal processing system in which both up count signals and down count signals occur at the same encoder positions.

Other objects of the invention will in part be obvious and will in part appear hereinafter.

The invention accordingly comprises the features of construction, combination of elements, and arrangements of parts, which will be exemplified in the construction hereinafter set forth, and the scope of the invention will be indicated in the claims.

For a fuller understanding of the nature and objects of the invention reference should be had to the following detailed description taken in connection with the accompanying drawings, in which:

FIG. 2 is a group of waveforms useful in understanding problems associated with incremental encoding using a simple circuit such as that shown in schematic form in FIG. 2a.

Figure 2A:
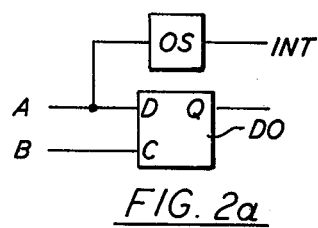
Figure 2B:
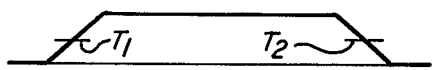
Figure 3A:
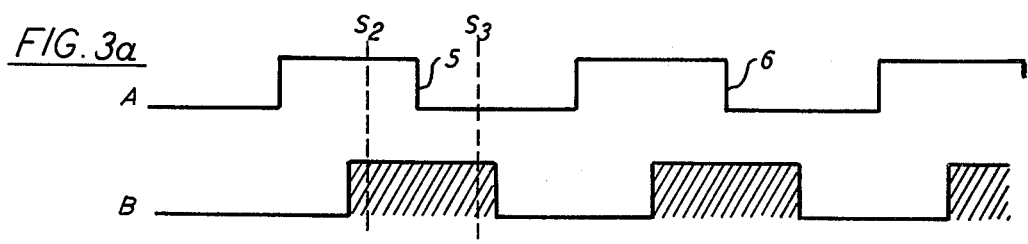

FIG. 2b and FIG. 3a contain waveform diagrams useful in understanding the invention.

Figure 1:
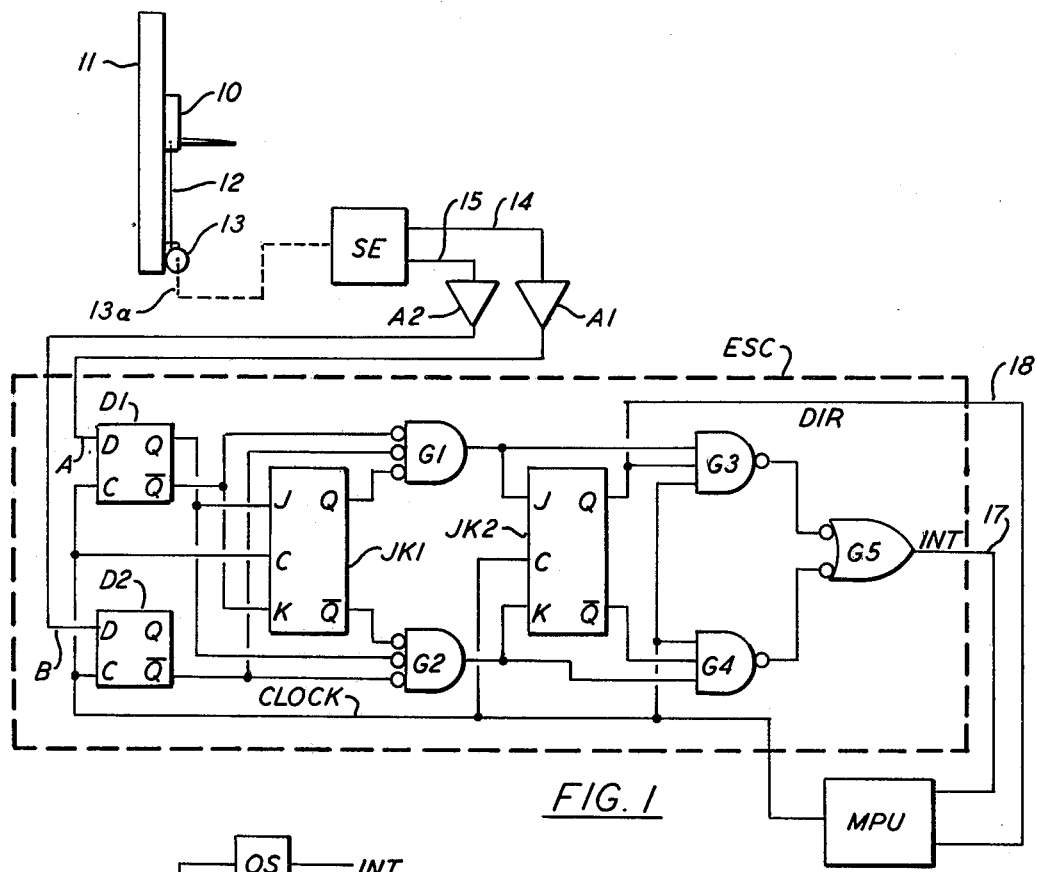
FIG. 1 is a schematic diagram illustrating a preferred form of the invention.

Referring to FIG. 1., as a conventional lift carriage 10 is raised or lowered along a mast 11 by conventional means not shown, cable 12 attached to the carriage is payed out from or reeled into spring-operated retractable reel 13 mounted near the base of the mast, rotating shaft 13a of the reel by amounts commensurate with carriage movement. Shaft 13a rotates a conventional shaft encoder SE, which may comprise, for example a Type 702 FS-300-OBLP-TTL sold by Disk Instruments Inc., Costa Mesa, California. The encoder provides a pair of quadrature-phased output signals on a pair of lines 14, 15. In a typical application each encoder output line will provide several hundred pulses as the encoder is turned through one revolution, and the diameter of reel 13 will be chosen so that perhaps 9600 pulses will occur on each of lines 14,15 as the carriage is raised or lowered over its total range of travel (e.g. 40 feet), so that a pulse occurs for each 0.05 inch of carriage travel.

The pulses from encoder SE are connected via conventional line driver amplifiers A1, A2 to an encoder state counter shown within dashed lines at ESC which forms a principal part of the present invention. The state counter ESC processes the signals from the encoder and provides signals on two lines 17,18 to a microprocessor MPU. As the carriage travels in one direction or the other, the state counter applies a brief (e.g. 500 nanoseconds) pulse on line 17 of each 0.05 inch of carriage travel, and the state of line 18 indicates whether carriage travel is progressing upwardly or downwardly. The signals on line 17 are applied as interrupt signals to processor MPU. Whenever an interrupt signal is applied to the MPU it interrupts whatever program or routine it is then executing and performs an interrupt routine stored in its memory. The interrupt routine involves sensing the state of line 18 to determine whether carriage movement at the time is upward or downward, and then incrementing or decrementing the count in a memory location, which may be referred to as HITE for sake of convenience. Thus memory location HITE keeps track of carriage elevation as the carriage is raised and lowered. If the MPU is byte-organized, as is common, the tally of counts indicating carriage elevation may be stored in two adjacent memory locations, one containing the least significant (LS) byte and the other the most significant (MS) byte.

In various control systems where an incremental encoder applies interrupt signals to a processor, it will be seen to be highly desirable, in order that the processor not waste large amounts of time servicing unnecessary interrupts, that noise, or jitter as the encoder vibrates and switches one of its inputs back and forth, not provide interrupt signals.

Figure 2:
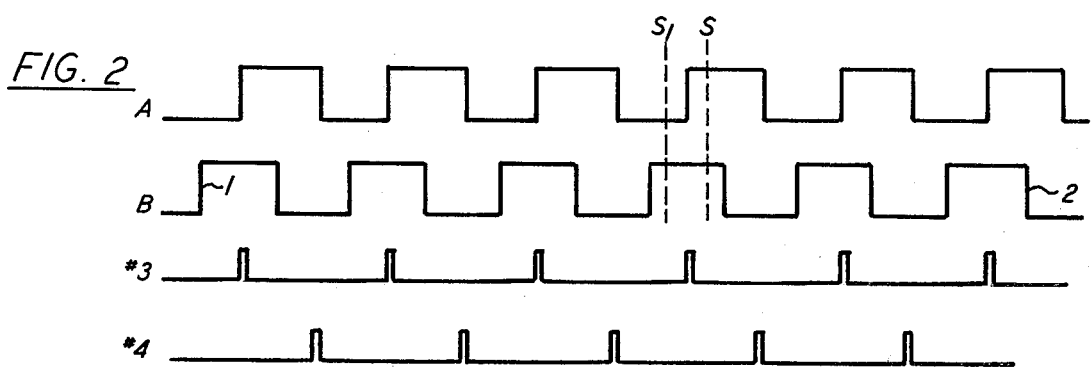

Referring to FIG. 2, if time is assumed to proceed from left to right, waveforms A and B represent how the signals from encoder SE vary with time as the encoder turns in one direction, and if time is instead assumed to proceed from right to left, waveforms A and B represent how the signals from the encoder vary with time for encoder rotation in the opposite direction. The transitions of the A and B waveforms are shown for sake of simplicity with no appreciable rise and fall times, although they may have very sloped edges, as is shown for waveform A in FIG. 2b, when the encoder is turning slowly. In any event circuitry connected to lines A and B will switch at certain thresholds, such as those shown at $T_1$ and $T_2$ in FIG. 2b.

The conditions of the A and B signals for a given angular position of the encoder can be specified by a vertical dashed line such as that shown at S in FIG. 2. In the encoder position represented by line S, both line A and line B are high, or in a logic 1 condition. An insight into problems which reversals of rotation and noise cause may be gained by first considering the simple approach illustrated by the circuit of FIG. 2a. The A and B signals from the encoder are shown connected respectively to the signal input terminal D and clock input terminal C, respectively, of a conventional D-type edge-triggered flip-flop DO. The A input line is in addition connected to the input line of a conventional "one-shot" multivibrator or pulser OS. With such an arrangement each rise of line A triggers one-shot OS to provide an interrupt signal on line INT. Each time line B rises flip-flop DO will be set or cleared, depending upon whether line A is high or low at the time B begins to rise. An output line Q of flip-flop D provides an indication whether to count up or count down.

If one considers how waveforms A and B vary while continuously proceeding left to right in FIG. 2 and the consequent effect of such signals on the circuit of FIG. 2a, it becomes apparent that flip-flop DO would be cleared as edge 1 was detected, and would remain cleared, since line A is low each time line B rises. One-shot OS would provide brief pulses following each rise of line A, at times indicated at waveform #3. If one then considers how A and B vary while continuously proceeding from right to left in FIG. 2, and the effect of such signals on the circuit of FIG. 2a, it will become apparent that flip-flop DO would be set as edge 2 was detected, and would remain set, and one-shot OS would provide pulses at times indicated at waveform #4. The system of FIG. 2a thus will be seen to function generally adequately for continuous counting in either direction, assuming an absence of noise. It may be noted, however, that the pulses at #3 for one direction of motion occur at different times or angular positions than those at #4 for the opposite direction.

Assume now that the encoder is stopped with lines A and B in the conditions represented by line S. If noise causes a succession of notches, or temporary decreases, in the signal on line A, the rise of line A following each notch of sufficient depth will cause a pulse from one-shot OS, resulting in either false incrementing or false decrementing, which depending upon the direction of travel immediately prior to stopping. If noise appeared simultaneously on line B, flip-flop DO could switch, and then upon resumption of encoder rotation one count could be tallied in the wrong direction before the flip-flop was switched back to its proper state. Now, assume that in the absence of noise the encoder oscillates back and forth between the conditions indicated by lines S and S2. Once during each cycle of such oscillation the rise of line A will cause a false count to be tallied, in a direction dependent upon the direction of motion just prior to such oscillation. When one considers the noisy environment aboard an electrically-powered lift truck and the oscillations and other reversals of carriage movement which occur, it becomes readily apparent that the simple approach illustrated in FIG. 2a is wholly inadequate to allow accurate tracking of carriage movement.

Referring back now to FIG. 1, the A and B lines from the encoder as shown connected respectively to the D input lines of D-type flip-flops D1 and D2. Squarewave pulses from a clock line are connected to the clock inputs of D1 and D2, and to other devices shown in FIG. 1. The clock pulse period will be assumed to be 1.0 microsecond. The clock pulses are shown being supplied by processor MPU, though that is by no means a requirement of the invention; a separate oscillator could be provided. As the clock line rises to begin one of its positive half-cycles of 500 nanoseconds, the data then on lines A and B promptly sets or clears D1 and D2, so that Q outputs of D1 and D2 essentially follow the voltages on lines A and B without substantial delay. The states of D1 and D2 cannot change in between successive rises of the clock line, however, so noise spikes or notches occurring during the intervening period of almost one microsecond will be ignored. Thus only noise occurring during the rising edge of the clock line can cause error.

The Q and $\overline{Q}$ output lines of D1 are connected to the J and K input lines, respectively, of a conventional JK flip-flop JK1, which also is clocked. As the clock line rises, JK1 stores the data from D1 without immediately changing the Q and $\overline{Q}$ outputs of JK1, changing those outputs to reflect the data from D1 only when the clock line falls. Thus it will be seen that if D1 is set (or cleared) as the clock line rises JK1 will be set (or cleared) approximately 500 nanoseconds later when the clock line falls.

A negative input and gate G1 connected to D1, D2 and JK1 is enabled only when D1 is set (A is high), D2 is set (B is high) and JK1 is cleared. Because any setting of D1 will cause a setting of JK1 about 500 nanoseconds later, it can be deduced that G1 can be enabled only when and if B is high, during the 500 nanosecond period from when A goes high (D1 is set) till JK1 is set. Thus G1 provides a half-microsecond pulse, if B is high, each time A rises.

A negative input and gate G2 is connected to D1, D2 and JK1 to be enabled only when D1 is cleared (A is low), D2 is set (B is high), and JK1 is set. Because any clearing of D1 will clear JK1 a half-microsecond later, it can be seen that G2 can be enabled only during the half-microsecond, while line B is high, which follows the fall of line A. Thus G2 provides a half-microsecond pulse, if B is high, each time A falls.

The output pulses from gates G1 and G2 are supplied, respectively, to the J and K inputs of a second JK flip-flop JK2. If the system is counting continuously in one direction, pulses will occur periodically from G1 but none from G2, while counting continuously in the other direction will provide a stream of pulses from G2 and none from G1. It is apparent that if a stream of pulses comes from G1, the first of such pulses will set JK2, and it will remain set when later pulses come from G1 as continuous counting continues in the same direction. Similarly, the first of a stream of pulses from G2 will clear JK2 for continuous counting in the other direction. The Q output of JK2 constitutes a counting direction signal, and it is connected via line 18 to the MPU.

The output pulses from G1 are applied to nand gate G3, which also receives the Q output from JK2 and the clock pulses. The output pulses from G2 are applied to nand gate G4 which also receives the $\overline{Q}$ output from JK2 and the clock pulses. If JK2 has been set by a pulse from G1, further pulses from G1 will be seen to enable G3, applying outputs to negative input or gate G5 which will raise line INT. Similarly, if JK2 has been cleared by a pulse from G2, further pulses from G2 will enable G4, raising line INT. However, if JK2 has been receiving pulses from G1 and is set, if travel direction reverses and pulses begin to emanate from G2 rather than G1, the first of the pulses coming from G2 will not result in a raising of line INT, since the set condition of JK2 when that first pulse comes from G2 will disable G4. Thus all pulses coming from gate G1 cause interrupt or counting occurrence pulses on line 17 except for the first pulse from G1 following a pulse from G2. If JK2 has been receiving pulses from G2 and is cleared, the first of a stream of pulses from G1 after reversal similarly will not cause line INT to rise since the cleared condition of JK2 will disable G3. Thus all pulses coming from gate G2 cause interrupt or counting occurrence pulses on line 17 except for the first pulse from G2 following a pulse from G1. The first of a group of pulses from G1 (or G2) is unable to enable G3 (or G4) because it is unable to switch the outputs of JK2 soon enough, the outputs of JK2 not changing until the fall of the clock pulse, which fall disables both G3 and G4.

In FIG. 3a the high states of line B, which signify the only times pulses can emanate from G1 and G2 are shown shaded. Edge 5 is a fall of line A for rotation in one direction, and a rise of line A for the opposite direction. If the encoder oscillates back and forth between the conditions represented by lines $S_2$ and $S_3$, pulses will alternately occur from G1 and G2, but none of those pulses will raise line INT to result in false counts. Further, if the system is stopped with line B high, the occurrence of extreme noise on line A, resulting in numerous rises and falls of line A, may switch JK flip-flop JK1 and JK2 back and forth numerous times, but line INT will not rise to cause false counting. If the system is stopped so that line B is low, JK2 will not be switched no matter what noise occurs on line A, since gates G1 and G2 will be disabled.

Edges 5 and 6 of waveform A in FIG. 3a each indicate a fall of A if one considers them left to right for one direction of encoder rotation, while conversely they each indicate a rise of A for the opposite direction of rotation. Since a rise in A (while B is high) causes a tally in one direction, and a fall in A (while B is high) causes a tally in the opposite direction, it will be seen that up counts and down counts occur at precisely the same encoder angular positions, with no shifting of count positions when one changes direction.

While the invention has been described in connection with a rotary shaft encoder, it will be apparent at this point that the invention could also be used with various reversible linear movement devices which provide phased-apart boolean or digital signals on two lines, such as various known forms of optical interferometers. The signals on the two lines need not be precisely in quadrature (exactly 90 degrees apart), although a phase relationship near 90 degrees is best to allow maximum counting speeds in either direction.

While the outputs on lines 17 and 18 are shown connected to a microprocessor, which comprises a rather complex form of counter as well as performing numerous other functions, it will be apparent that the signals on lines 17 and 18 can instead control any one of numerous known types of counters which have count occurrence and count direction input lines.

While the circuit shown in FIG. 1 causes counting occurrence or interrupt pulses upon the rise or fall of line A while line B is high, it will become apparent that the circuit could be easily modified to instead provide the interrupt signals while line B is low. Various changes can be made in the types of gates shown in accordance with standard techniques.

It will thus be seen that the objects set forth above, among those made apparent from the preceding description, are efficiently attained. Since certain changes may be made in carrying out the above method and in the construction set forth without departing from the scope of the invention, it is intended that all matter contained in the above description or shown in the accompanying drawings shall be interpreted as illustrative and not in a limiting sense.

The embodiments of the invention in which an exclusive property or privilege is claimed are defined as follows:

1. The method of indicating the movement of a device which provides a pair of phased-apart boolean signals which rise and fall between low and high values on first and second lines, which comprises the steps of: providing a first pulse each time the signal on said first line rises if the signal on said second line is at a predetermined one of its values; providing a second pulse each time the signal on said first line falls if the signal on said second line is at said predetermined one of its values; sensing the occurrence of said first and second pulses to provide a counting direction signal; combining said first pulses, except for each first pulse first following a second pulse, and said second pulses, except for each second pulse first following a first pulse, to provide counting occurrence signals; and causing each counting occurrence signal to increment or decrement a counter in accordance with the state of said counting direction signal.

2. Apparatus for tracking operation of a device which provides a pair of phased-apart signals which rise and fall between low and high values on first and second lines, comprising, in combination: means for providing a first pulse each time the signal on said first line rises if the signal on said second line is at a predetermined one of its values; means for providing a second pulse each time the signal on said first line falls if the signal on said second line is at said predetermined one of its values; means for sensing occurrences of said first and second pulses to provide a counting direction logic signal; logic means for combining said first pulses, except for first pulse first following a second pulse and said second pulses, except for each second pulse first following a first pulse, to provide count occurrence signals, and reversible counting means connected to be incremented or decremented by said count occurrence signals in accordance with the states of said counting direction signal at the times of occurrence of said count occurrence signals.

3. Apparatus according to claim 2 wherein said logic means includes first and second gates connected to receive said first and second pulses, respectively, said means for sensing being switchable after receipt of one of said first pulses to conditionally enable said first gate to pass succeeding ones of said first pulses and being switchable after receipt of one of said second pulses to conditionally enable said second gate to pass succeeding ones of said second pulses.

4. Apparatus according to claim 2 wherein said means for providing said first and second pulses comprise first and second edge-triggered flip-flops connected to receive the signals on said first and second lines, respectively, to be set or cleared at the beginning of each of a succession of clock pulses, a third flip-flop connected to be set or cleared at the end of each clock pulse in accordance with the set or cleared condition of said first edge-triggered flip-flop during the clock pulse, and first and second gates controlled by said flip-flops to provide said first and second pulses.

5. Apparatus according to claim 3 having a clock line which alternates between first and second values, said clock line being connected to conditionally enable said first and second gates while said clock line lies at the first of its values, and said clock line being connected to switch said means for sensing, in accordance with the first pulse or second pulse received by said means for sensing while said clock line lies at the first of its values, as said clock line changes from the first of its values to the second of its values.

* * * * *